(12) United States Patent
Liu et al.

(10) Patent No.: US 11,368,804 B1
(45) Date of Patent: Jun. 21, 2022

(54) TESTING APPARATUS AND TESTING METHOD THEREOF

(71) Applicant: xMEMS Labs, Inc., Santa Clara, CA (US)

(72) Inventors: Yuan-Shuang Liu, Hsinchu County (TW); David Hong, Los Altos, CA (US); Ming-Che Chuang, Miaoli County (TW); Ping-Sheng Wang, Hsinchu County (TW)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 17/364,833

(22) Filed: Jun. 30, 2021

Related U.S. Application Data

(60) Provisional application No. 63/165,163, filed on Mar. 24, 2021.

(51) Int. Cl.
*H04R 29/00* (2006.01)
*B81C 99/00* (2010.01)

(52) U.S. Cl.
CPC ......... *H04R 29/001* (2013.01); *B81C 99/005* (2013.01); *B81C 99/0045* (2013.01); *H04R 2201/003* (2013.01)

(58) Field of Classification Search
CPC ............ H04R 29/001; H04R 2201/003; B81C 99/0045; B81C 99/005
See application file for complete search history.

(56) References Cited

U.S. PATENT DOCUMENTS

| 2013/0200916 A1* | 8/2013 | Panagas | H01L 21/67727 324/757.01 |
| 2015/0117654 A1* | 4/2015 | John | H04R 29/004 381/59 |

FOREIGN PATENT DOCUMENTS

CN          110720227          *   1/2020

OTHER PUBLICATIONS

Khenkin, "Testing multiple electroacoustic devices", Jan. 21, 2020 (Year: 2020).*

* cited by examiner

*Primary Examiner* — Mark Fischer
(74) *Attorney, Agent, or Firm* — Winston Hsu

(57) ABSTRACT

A testing apparatus including a testing platform, a loading device, a testing-signal generating device, a sound sensing device, a control unit, and an unloading device is disclosed. The loading device is configured to load a plurality of under-test devices to the testing platform. The testing-signal generating device is configured to generate at least one testing signal. The plurality of under-test devices receives the at least one testing signal and produces at least one testing sound according to the at least one testing signal. The sound sensing device is configured to receive the at least one testing sound. The control unit controls the unloading device to unload the plurality of under-test devices from the testing platform and controls the unloading device to categorize the plurality of under-test devices into a plurality of groups according to the at least one testing sound received by the sound sensing device.

14 Claims, 16 Drawing Sheets

TESTING APPARATUS AND TESTING METHOD THEREOF

CROSS REFERENCE TO RELATED APPLICATIONS

This application claims the benefit of U.S. provisional application No. 63/165,163, filed on Mar. 24, 2021, which are incorporated herein by reference.

BACKGROUND OF THE INVENTION

1. Field of the Invention

The present invention relates to a testing apparatus and a testing method thereof, and more particularly, to a testing apparatus and a testing method thereof capable of increasing testing efficiency and quality.

2. Description of the Prior Art

MEMS sound transducers are typically manufactured in wafer form in a semiconductor manufacturing process. After the semiconductor manufacturing process, the wafer is separated into individual MEMS die in a singular/sawing process and then assembled into a protective package structure in a packaging process.

Test is the process of attempting to sort defective products from non-defective ones. Rapid and accurate acoustic testing of MEMS sound transducers is of continued interest to manufacturers. However, the MEMS sound transducers are normally tested manually, which can bring various challenges and costs time, money and effort. Manual testing would limit the number of MEMS sound transducers that could be tested at one time. During testing, the MEMS sound transducer is attached to a test board and placed next to a microphone inside an acoustical chamber. It is difficult to transport between a position outside the acoustical chamber in an exposed state and a second position inside the acoustical chamber in a shielded state stably and rapidly. Soundproof problems exist in manual testing approach as well. The distance between the MEMS sound transducer and the microphone is calibrated/adjusted manually each time, which reduces accuracy.

Therefore, there is still room for improvement when it comes to acoustical testing of MEMS sound transducers.

SUMMARY OF THE INVENTION

It is therefore a primary objective of the present invention to provide a testing apparatus and a testing method thereof capable of increasing testing efficiency and quality.

An embodiment of the present invention provides a testing apparatus, comprising a testing platform; a loading device, configured to load a plurality of under-test devices to the testing platform; a testing-signal generating device, configured to generate at least one testing signal, wherein the plurality of under-test devices receives the at least one testing signal and produces at least one testing sound according to the at least one testing signal; a sound sensing device, configured to receive the at least one testing sound; a control unit; and an unloading device, wherein the control unit controls the unloading device to unload the plurality of under-test devices from the testing platform and controls the unloading device to categorize the plurality of under-test devices into a plurality of groups according to the at least one testing sound received by the sound sensing device.

Another embodiment of the present invention provides a testing method, comprising loading a plurality of under-test devices to the testing platform; generating at least one testing signal; the plurality of under-test devices receiving the at least one testing signal and producing at least one testing sound according to the at least one testing signal; and categorizing the plurality of under-test devices into a plurality of groups according to the at least one testing sound received by a sound sensing device.

Another embodiment of the present invention provides a testing method, comprising generating a plurality of testing signals, wherein the plurality of testing signals has a plurality of tones; delivering the plurality of testing signals with the plurality of tones to the plurality of under-test devices; the plurality of under-test devices producing a testing sound according to the plurality of testing signals; and categorizing the plurality of under-test devices into a plurality of groups according to a testing sound according to the plurality of testing signals with the plurality of tones.

These and other objectives of the present invention will no doubt become obvious to those of ordinary skill in the art after reading the following detailed description of the preferred embodiment that is illustrated in the various figures and drawings.

DETAILED DESCRIPTION

A testing method disclosed in the present application makes use of the conventional semiconductor testing process for mass production to ensure high reliability and achieve high throughput. However, compared to the conventional semiconductor testing process, microphone(s) is/are disposed in a testing apparatus of the present application since the present application aims to perform (final) test on (semiconductor packaged) speakers. In addition, to improve testing quality, the testing apparatus of the present application further includes a sealing component to prevent air pressure changes of a back/second sub-chamber of a speaker from interfering with air pressure changes of a front/first sub-chamber of the speaker during testing.

Figure 1:
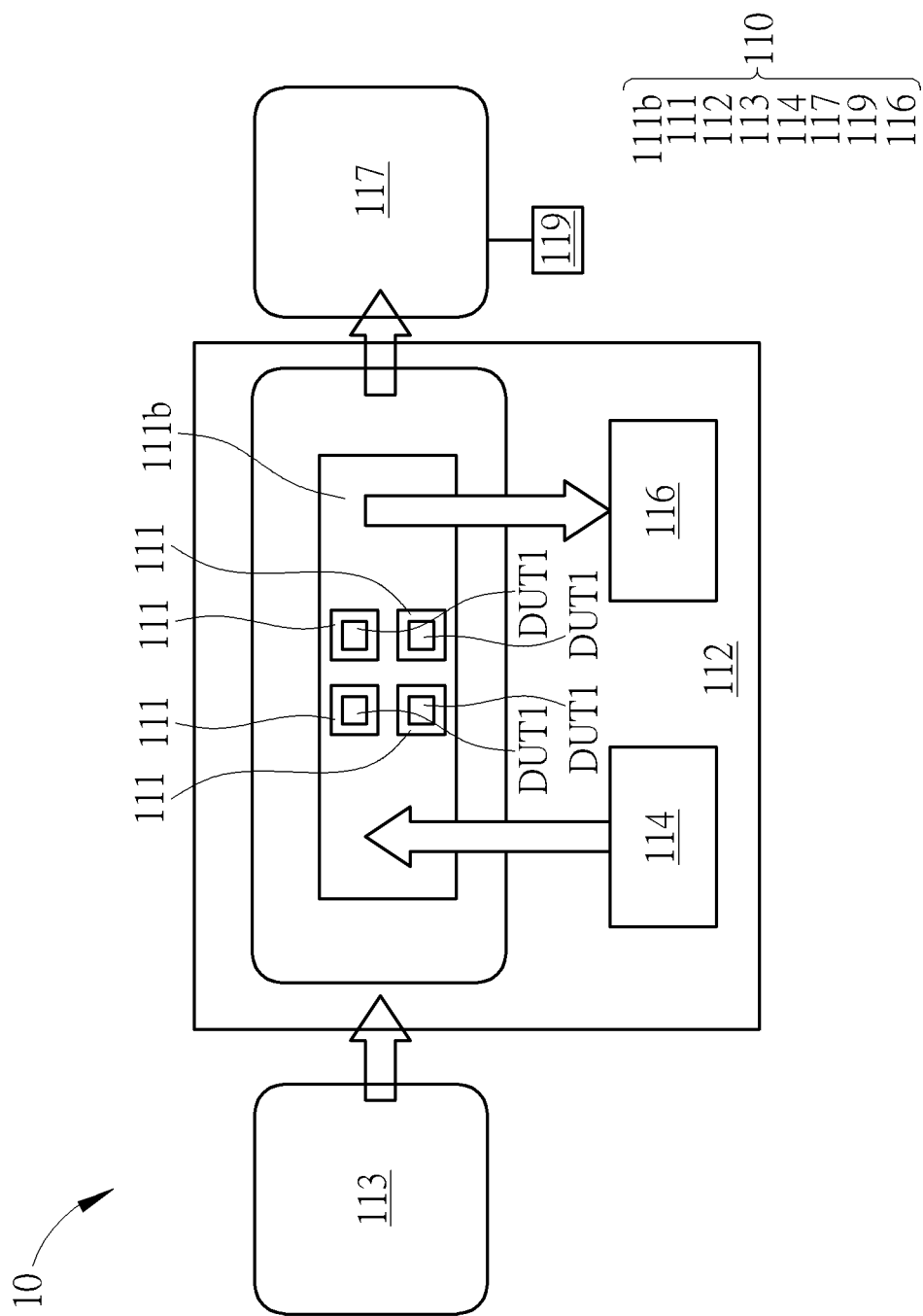
FIG. 1 is a schematic diagram of an acoustic testing system according to an embodiment of the present invention.

FIG. 1 is a schematic diagram of an acoustic testing system 10 according to an embodiment of the present invention. The acoustic testing system 10 includes under-test devices DUT1 and a testing apparatus 110. The testing apparatus 110 is similar to a conventional handler. As known by the art, the handler is usually used for final test on manufactured semiconductor devices for mass production. As a handler, the testing apparatus 110 may include sockets 111, a testing platform 112, a loading device 113, a testing-signal generating device 114, a tester 116, an unloading device 117, and a control unit 119. High-volume testing is automated with the testing apparatus 110.

Different from the traditional handler for final test of semiconductor devices which do not produce sound, the testing apparatus 110, for acoustic testing, further comprises sound sensing device(s) (e.g., a sound sensing device 315 in FIG. 3), which is for final testing of sound producing devices manufactured by semiconductor process, especially for mass production.

The control unit 119 may be a controller or controlling circuit, which may be realized/implemented by processing circuit(s) (e.g., CPU (central processing unit), MCU (microcontroller unit) or a controller), logic or digital circuit(s), or ASIC (application specific integrated circuit), which is not limited thereto. As long as the control unit 119 can be programmed to execute certain controlling program, requirement of the control unit 119 is satisfied.

The loading device 113 is configured to move the under-test devices DUT1 from a tray/carrier and load the under-test devices DUT1 onto the testing platform 112. The loading device 113 may be robotic arm(s) to perform automatic actions of picking and placing of the under-test devices DUT1, and thus may be implemented by a loader of the conventional semiconductor testing apparatus.

Figure 16:
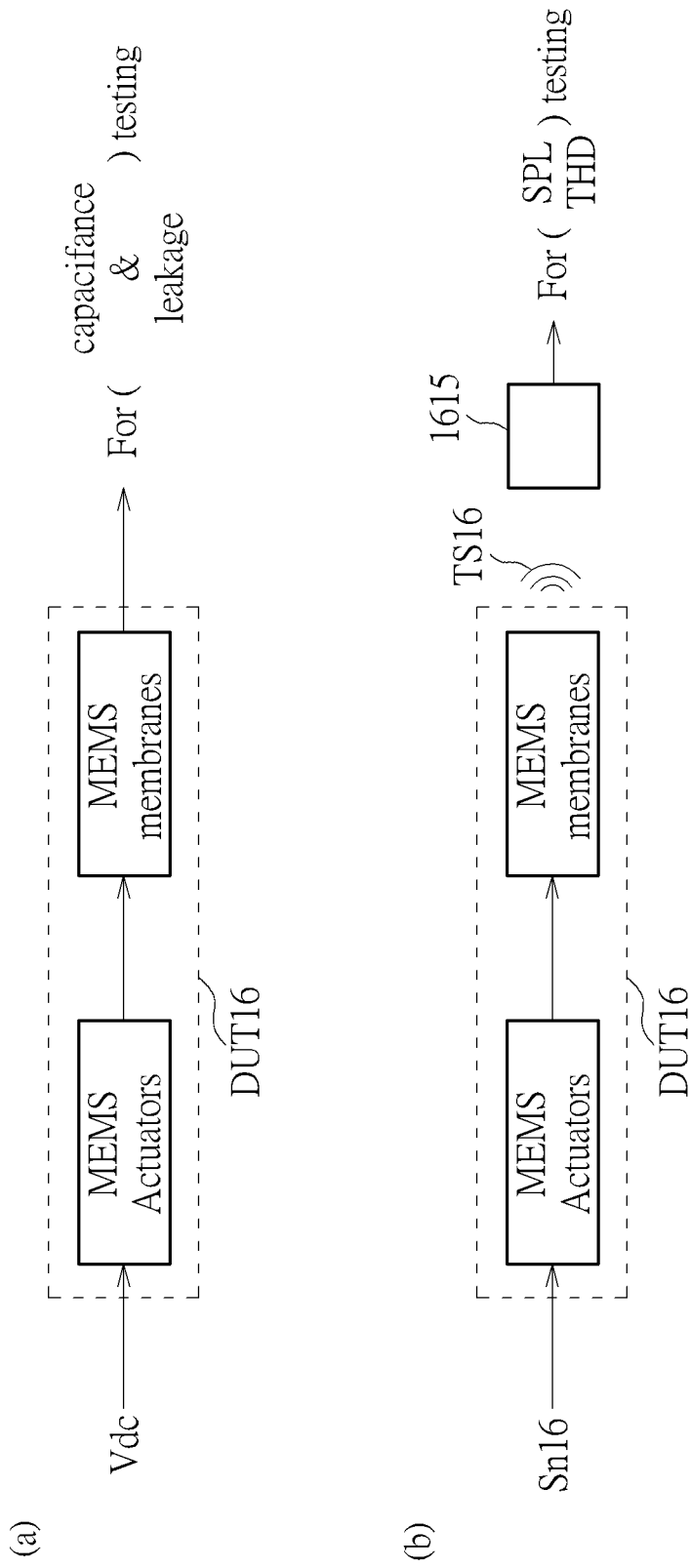
FIG. 16 is a schematic diagram of an acoustic testing system according to an embodiment of the present invention.

The testing-signal generating device 114 is configured to generate testing signal(s) (such as DC voltage(s) Vdc or input signal(s) Sn16 in FIG. 16). After the under-test devices DUT1 are placed within the testing platform 112 by the loading device 113, each of the under-test devices DUT1 may receive the testing signal(s) and then produce a testing sound (such as a testing sound TS16 in FIG. 16) according to the testing signal(s).

The sound sensing device(s) mount on the testing platform 112 are configured to receive the testing sound(s). Each sound sensing device may be implemented by a microphone.

The unloading device 117 is configured to remove the under-test devices DUT1 from the testing platform 112. The unloading device 117 may be robotic arm(s), and thus may be implemented by an unloader of the conventional semiconductor testing apparatus.

The control unit 119 controls the unloading device 117 to unload the under-test devices DUT1 from the testing platform 112 and controls the unloading device 117 to categorize the under-test devices DUT1 into groups according to the testing sounds, which are produced from the under-test devices DUT1 and received by the sound sensing device(s). For example, the testing sound may be analyzed (by the tester 116) to determine the performance of the under-test device DUT1 corresponding to the testing sound. The control unit 119 may then notify the unloading device 117 which bin/tray the under-test device DUT1 would be assigned to according to the results of the test/analysis. If the testing sound satisfies certain requirement(s), the under-test device DUT1 is categorized into a passing group or a first class group. Otherwise, the under-test device DUT1 is categorized into a failed group or other class group.

In a word, the testing apparatus 110 makes use of the conventional semiconductor testing apparatus for mass production to ensure high reliability and achieve high throughput. In addition, the sound sensing device(s) of the testing apparatus 110 facilitates acoustic test on the under-test device DUT1.

The sockets 111 disposed (in a kit/socket board 111b with pogo pins) on the testing platform 112 of the testing apparatus 110 may be designed in a sophisticated approach according to the structure of the under-test device DUT1 to improve testing quality and/or enhance the quality of the testing sound being generated.

Specifically, different from traditional sockets on the handler, the socket of the present application may further comprise a sealing component. The sealing component is configured to isolate a first chamber from a second chamber formed within the under-test device, so as to achieve better testing sound quality.

Figure 2:
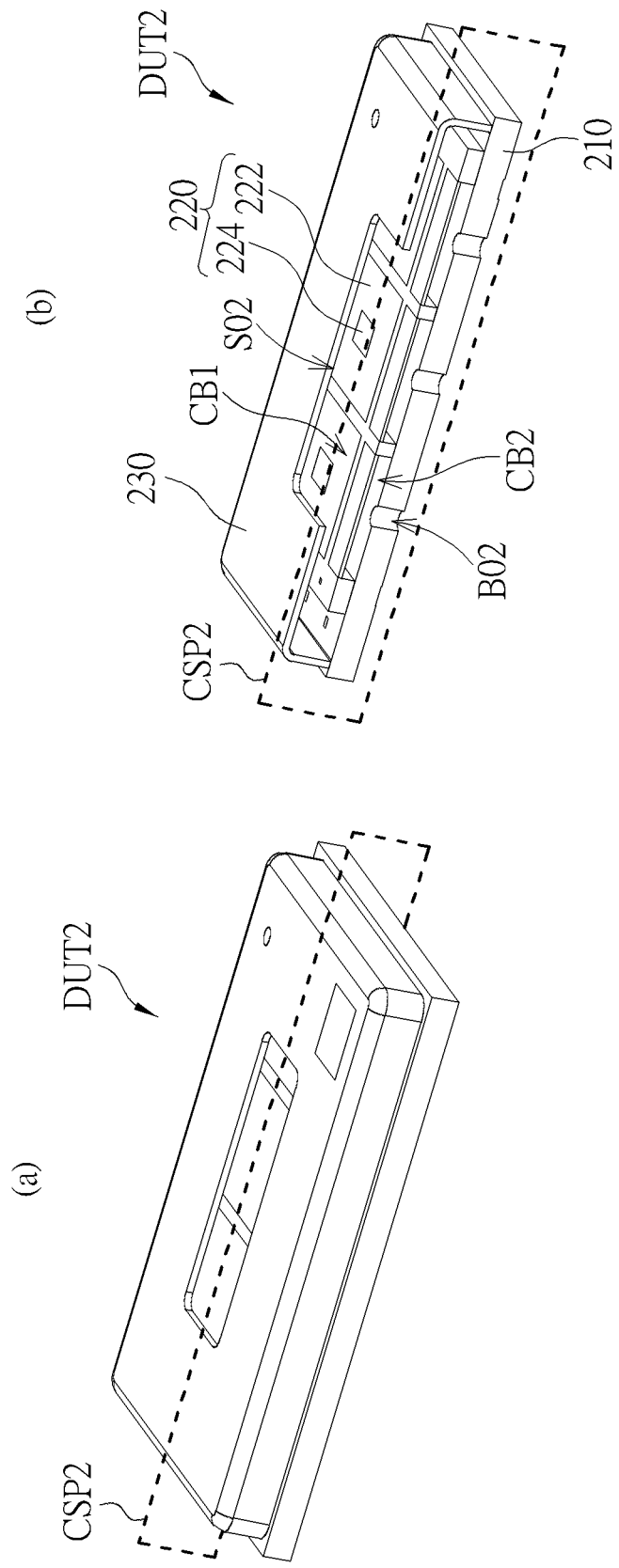
FIG. 2 is a schematic diagram of an under-test device according to an embodiment of the present invention.
Figure 3:
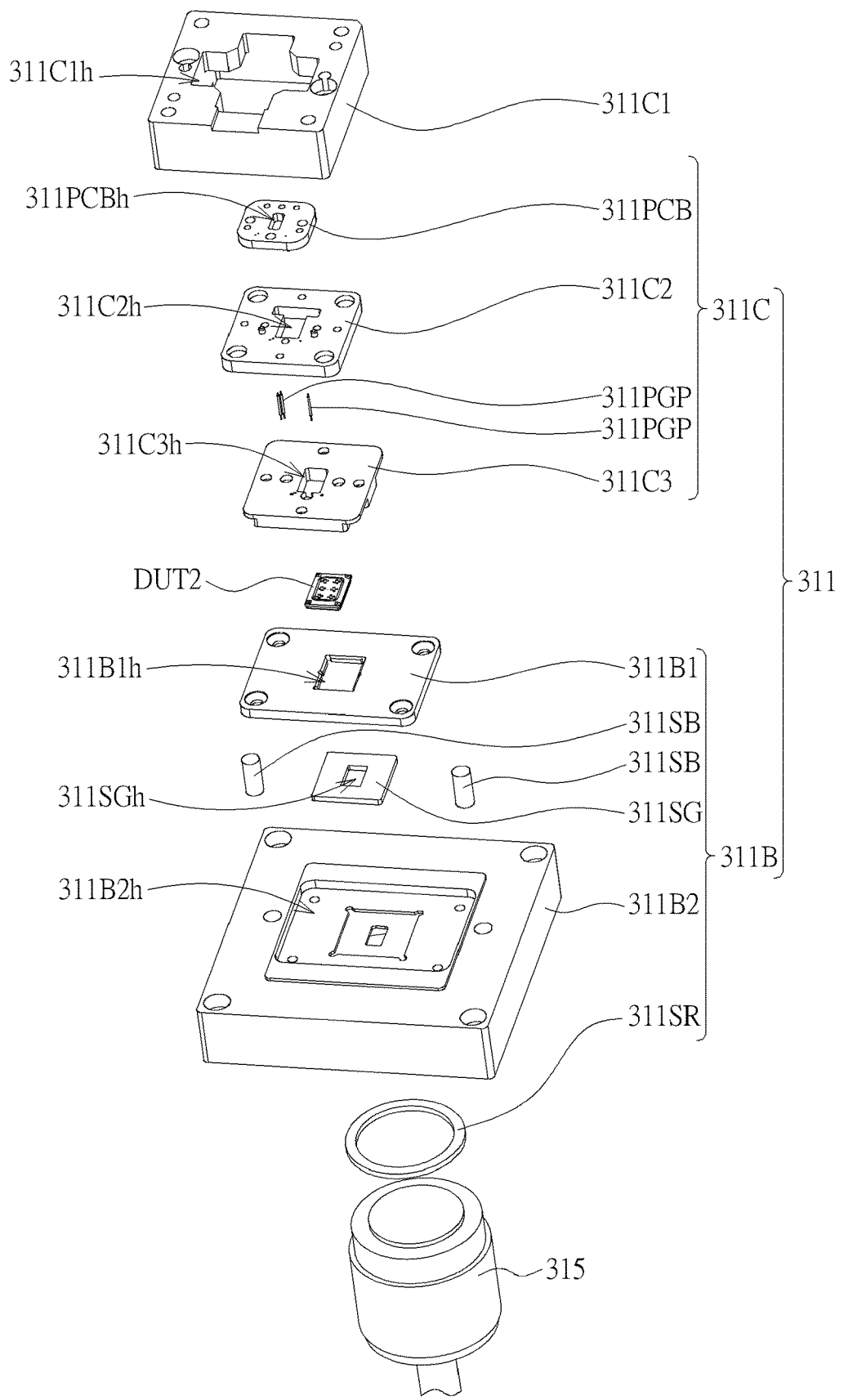
FIG. 3 is a schematic diagram of a socket, the sound sensing device, and the under-test device shown in FIG. 2 in an exploded view according to an embodiment of the present invention.
Figure 4:
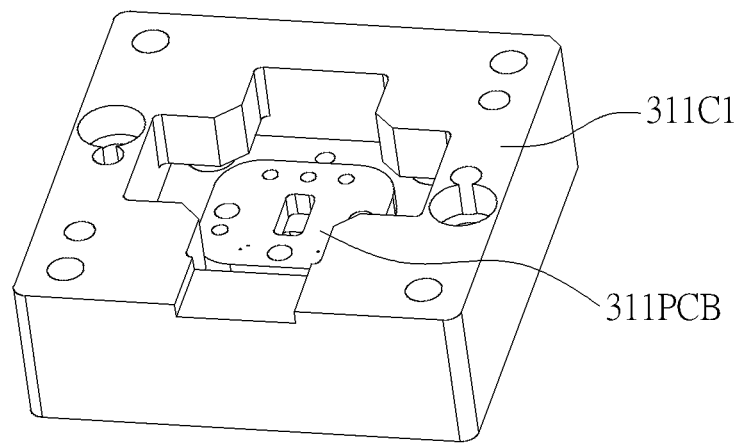
FIG. 4 is a schematic diagram illustrating the socket, the sound sensing device, and the under-test device shown in FIG. 3 when the socket is open/exposed.
Figure 4:
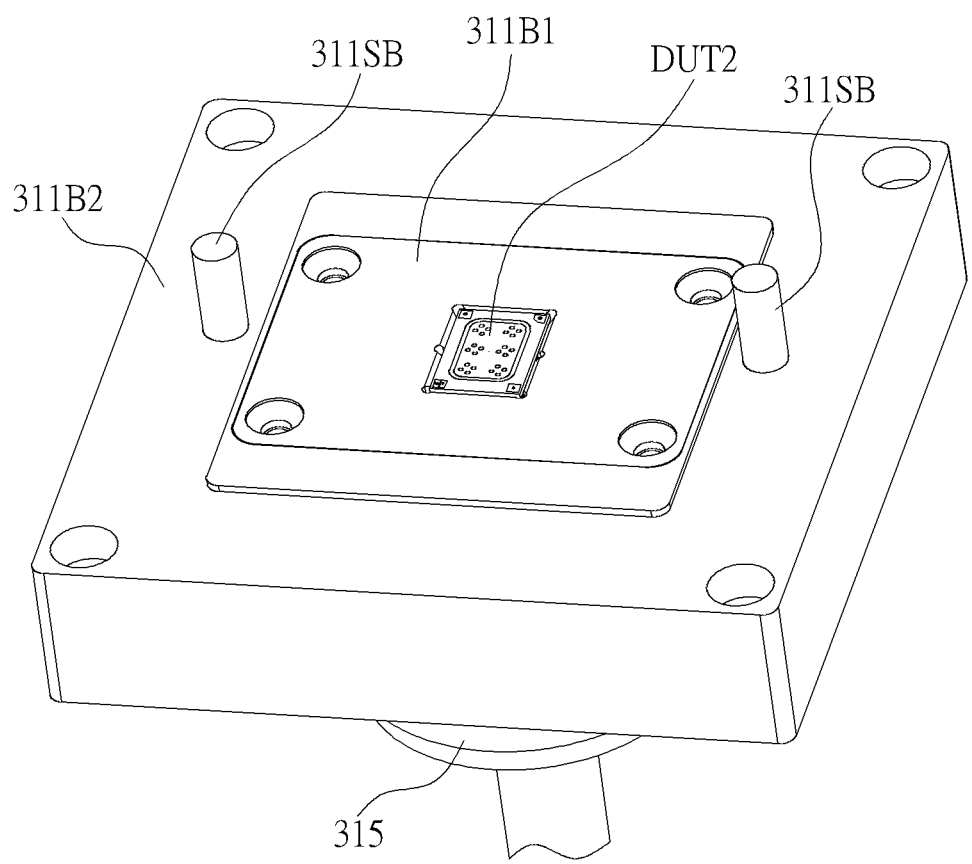
Figure 5:
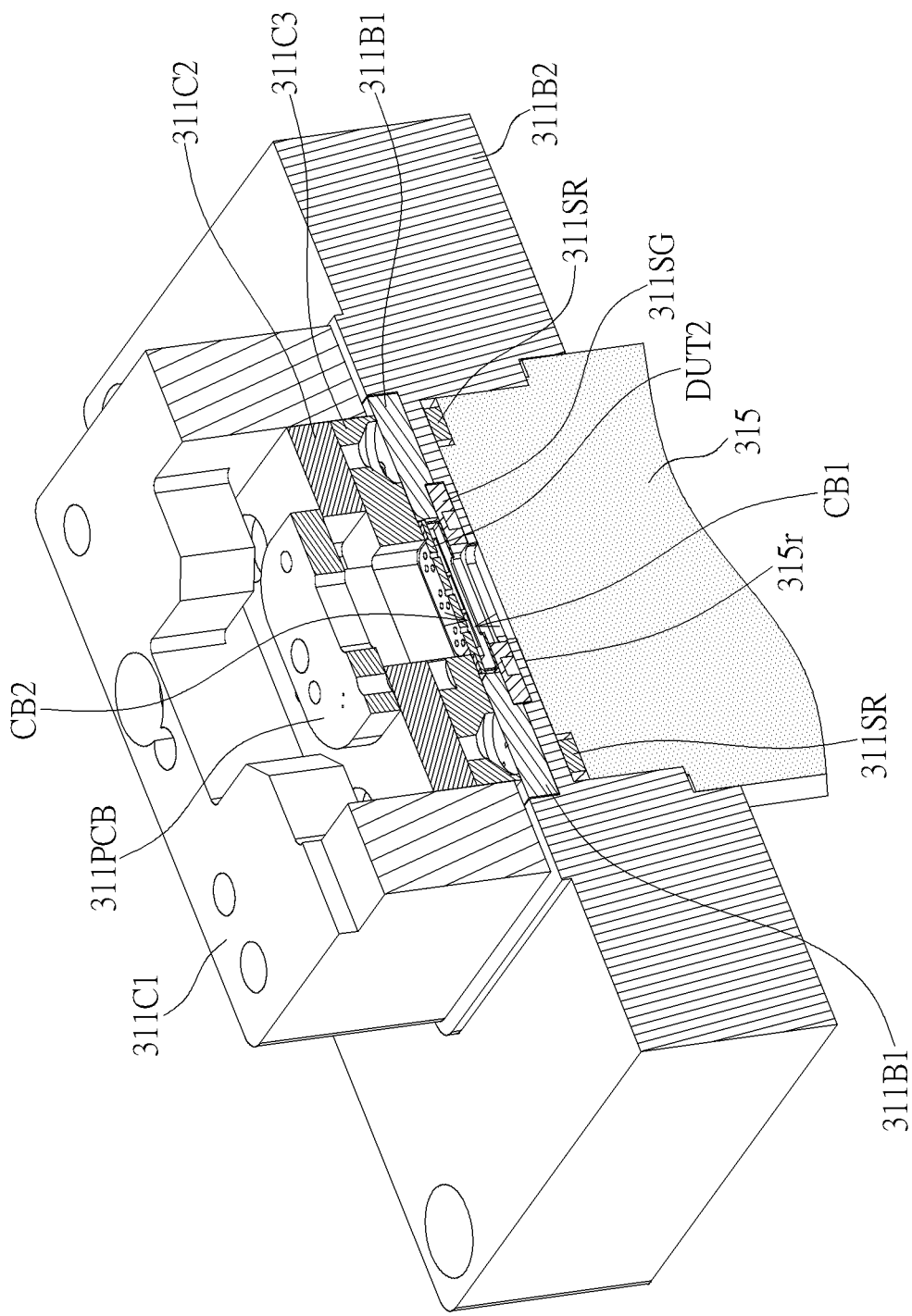
FIG. 5 is a schematic diagram illustrating the socket, the sound sensing device, and the under-test device shown in FIG. 3 when the socket is closed/shielded.
Figure 6:
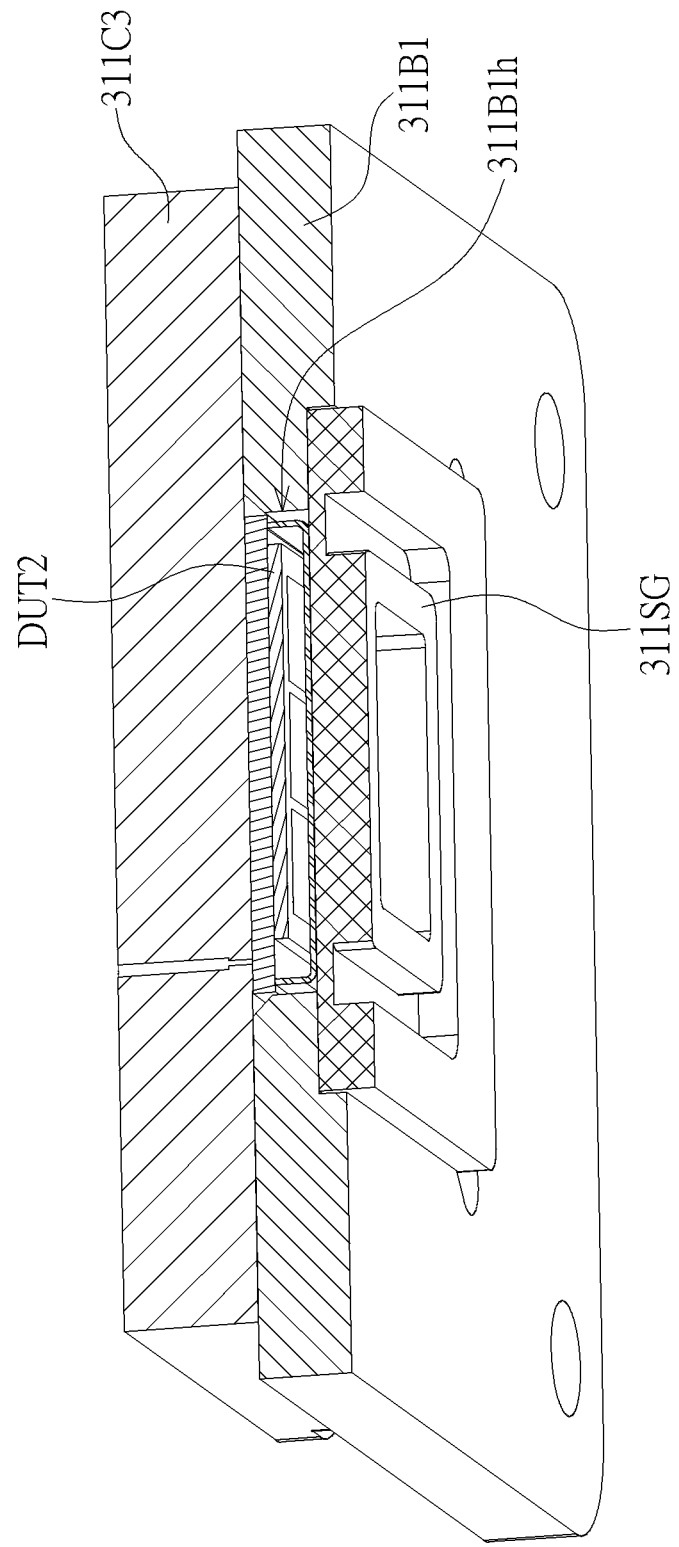
FIG. 6 is a schematic diagram of the socket and the sound sensing device shown in FIG. 3.

For example, FIG. 2 is a schematic diagram of an under-test device DUT2 according to an embodiment of the present invention. FIG. 3 is a schematic diagram of a socket 311, the sound sensing device 315, and the under-test device DUT2 shown in FIG. 2 in an exploded view according to an embodiment of the present invention. FIG. 4 is a schematic diagram illustrating the socket 311, the sound sensing device 315, and the under-test device DUT2 when the socket 311 is open/exposed. FIG. 5 is a schematic diagram illustrating the socket 311, the sound sensing device 315, and the under-test device DUT2 when the socket 311 is closed/shielded. FIG. 6 is a schematic diagram of the socket 311 and the sound sensing device 315.

FIG. 2a illustrates a view of the under-test device DUT2. FIG. 2b illustrates a cross-sectional view taken along a cross-sectional plane CSP2 shown in FIG. 2a. As shown in FIG. 2, the under-test device DUT2 may include a base 210, a chip 220, a cap 230 and a chamber CB. The under-test device DUT2 may have a package structure similar to that disclosed in U.S. application Ser. No. 16/699,078, which is incorporated herein by reference.

The chip 220 may include a membrane 222 and an actuator 224 (which may be similar to that disclosed in U.S. application Ser. No. 16/920,384 or Ser. No. 16/699,078, which are incorporated herein by reference). The membrane 222, which is configured to produce a testing sound (by, for example, generating air pulses), may partition the chamber CB into a front/first sub-chamber CB1 and a back/second sub-chamber CB2. The front/first sub-chamber CB1 is situated between the membrane 222 and the cap 230; the back/second sub-chamber CB2 is situated between the membrane 222 and the base 210.

The cap 230 of the under-test device DUT2 may have a sound outlet opening S02 connected to the front/first sub-chamber CB1, such that the testing sound generated by the membrane 222 may propagate outwards through the sound outlet opening S02. The sound outlet opening S02 may be situated on the upper side of the chip 120 and may face the membrane 222 (parallel to the upper side). Therefore, the under-test device DUT2 may be classified into a top firing sound producing device. In other words, top firing refers to a package structure where the sound outlet opening is formed on a top structure/plate of the cap 230, as shown in FIG. 2, and the top structure/plate of the cap 230 is (substantially) parallel to the membrane 222.

The base 210 of the under-test device DUT2 may have back opening(s) B02 connected to the back/second sub-chamber CB2 so as to, for example, allow air to flow in/out freely, and/or bonding pad(s) BP3 disposed on the outermost side of the base 210. The size of the back opening B02 is less than or equal to the sound outlet opening S02. The bonding pad(s) BP3 may be electrically connected to the chip 220 through trace(s)/wire(s), such that the actuator 224 of the chip 220 is able to receive signal(s) such as the testing signal(s) from outside.

FIG. 4 and FIG. 5 illustrate the operating principle of the socket 311. The socket 311 may include a socket cover 311C and a socket base 311B. The socket base 311B may be mounted/fixed on the testing platform 112. After the loading device 113 takes the under-test device DUT2 and puts the under-test device DUT2 into the socket 311 as shown in FIG. 4, the socket cover 311C may exert a moderate force downwards to the top of the under-test device DUT2 and/or the top of the socket base 311B to make the socket cover 311C come into contact with the under-test device DUT2 and/or the socket base 311B as shown in FIG. 5. The under-test device DUT2 may be thus inserted between the socket cover 311C and the socket base 311B for fast automated (final) test.

As shown in FIG. 3, the socket cover 311C may include socket cover components 311C1-311C3, (springy) pogo pins 311PGP, and/or a printed circuit board 311PCB. The socket cover components 311C1-311C3 are individual parts being assembled to fix/house the printed circuit board 311PCB and the pogo pins 311PGP.

During testing, the (open/exposed) socket base 311B is closed/shielded with the socket cover 311C as shown in FIG. 5. The bonding pad(s) BP3 of the under-test device DUT2 may connect to the printed circuit board 311PCB through the pogo pins 311PGP (or other pressure-type connector(s) in other embodiments), and the testing-signal generating device 114 may be connected to the printed circuit board 311PCB. As a result, the testing signal(s) is transmitted from the testing-signal generating device 114 to the under-test device DUT2, and the under-test device DUT2 may produce the testing sound downwards according to the testing signal(s).

To expel air from the back/second sub-chamber CB2 to the outside, the socket cover components 311C1-311C3 and the printed circuit board 311PCB have openings 311C1h-311C3h and 311PCBh respectively. As shown in FIG. 5, the openings 311C1h-311C3h and 311PCBh of the socket 311 are designed according to the distribution of the back opening(s) B02 of the under-test device DUT2 so as to, for example, allow air to flow in/out freely. Take the socket cover component 311C3 as an example: The area of the opening 311C3h is larger than or equal to the distribution area of the back opening(s) B02, which may be distributed in the central region of the base 210 of the under-test device DUT2. The opening 311C3h overlaps all the back opening(s) B02.

As shown in FIG. 3, the socket base 311B may include socket base components 311B1-311B2, a sealing component 311SG, silicone bars 311SB and/or a silicone ring 311SG. The socket base components 311B1-311B2 and the socket board 111b are individual parts being assembled to fix/house the sealing component 311SG, the silicone bars 311SB, the silicone ring 311SG, and the sound sensing device 315. For example, the area/perimeter/contour of an opening 311B1h of the socket base component 311B1 is similar to (is the same as or matches) the area/perimeter/contour of the under-test device DUT2 such that the under-test device DUT2 may be fixed or stuck in the opening 311B1h.

To transmit the testing sound from the sound outlet opening S02 of the under-test device DUT2, the socket base component 311B2 and the sealing component 311SG have openings 311B2h and 311SGh respectively. As shown in FIG. 5, the openings 311B2h and 311SGh of the socket 311 are designed according to the size of the sound outlet opening S02 of the under-test device DUT2 so as to, for example, output the testing sound to the sound sensing device 315. Take the sealing component 311SG as an example: The area of the opening 311SGh is larger than or equal to the area of the sound outlet opening S02 to avoid the sealing component 311SG from blocking/covering the sound outlet opening S02. The opening 311SGh overlaps the sound outlet opening S02. The geometric center of the sound outlet opening S02 is roughly aligned to the geometric center of the opening 311SGh of the sealing component 311SG or the geometric center of a receiving surface 315r of the sound sensing device 315.

As shown in FIG. 5, the socket base components 311B1-311B2, the sealing component 311SG, and the silicone ring 311SG erect barriers to prevent noises to seep through and confine the testing sound to a closed space enclosed by the socket base components 311B1-311B2, the sealing component 311SG, and the sound sensing device 315.

More specifically, the sealing component 311SG (serving as a sealing gasket) of the socket 311 is configured to isolate the front/first sub-chamber CB1 of the under-test device DUT2 from the back/second sub-chamber CB2 of the under-test device DUT2 as shown in FIG. 5 when the under-test device DUT2, which has been shuttled into the testing platform 112 by the loading device 113, produces the testing sound according to the testing signal(s). Hence, when the membrane 222 of the under-test device DUT2 vibrates to cause slight changes in air pressure, air pressure changes of the back/second sub-chamber CB2 would not interfere with those of the front/first sub-chamber CB1. The air pressure changes of the front/first sub-chamber CB1 travel as waves through the openings 311B1h-311B2h and 311SGh of the socket base 311B and are detected/measured by the sound sensing device 315.

The sealing component 311SG may be made from a material that is to some degree yielding such that the sealing component 311SG is able to deform, to tightly fill the space which the sealing component 311SG is designed for, and/or to seal the (slightly irregular) gap among the socket base components 311B1-311B2 and the under-test device DUT2. The sealing component 311SG may be made from silicone; alternatively, the sealing component 311SG may be made from paper, rubber, metal, cork, felt, neoprene, nitrile rubber, fiberglass, polytetrafluoroethylene (known as PTFE or Teflon) or a plastic polymer (such as polychlorotrifluoroethylene). The hardness of the sealing component 311SG may be 20 N/mm² (newtons per square millimeter).

In a word, the socket base 311B of the socket 311 has the openings 311B1h-311B2h and 311SGh for the testing sound from the under-test device DUT2 to pass through and travel outwards to the sound sensing device 315. The sealing component 311SG (under compression) prevents air leakage from the back/second sub-chamber CB2 and/or into the front/first sub-chamber CB1 during testing, such that the air pressure changes of the back/second sub-chamber CB2 would propagate across the openings 311C1h-311C3h and 311PCBh of the socket cover 311C of the socket 311 without interfering with the air pressure changes of the front/first sub-chamber CB1. These improve testing quality and/or enhance the quality of the testing sound being generated.

Figure 7:
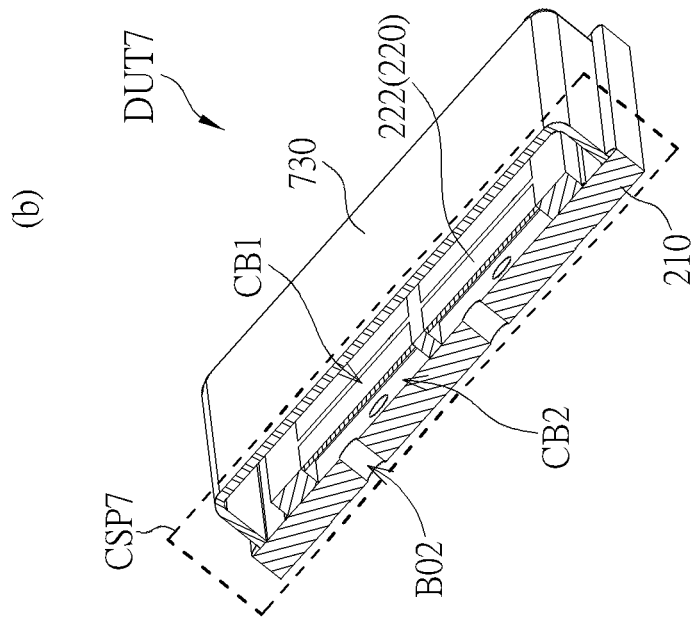
FIG. 7 is a schematic diagram of an under-test device according to an embodiment of the present invention.
Figure 7:
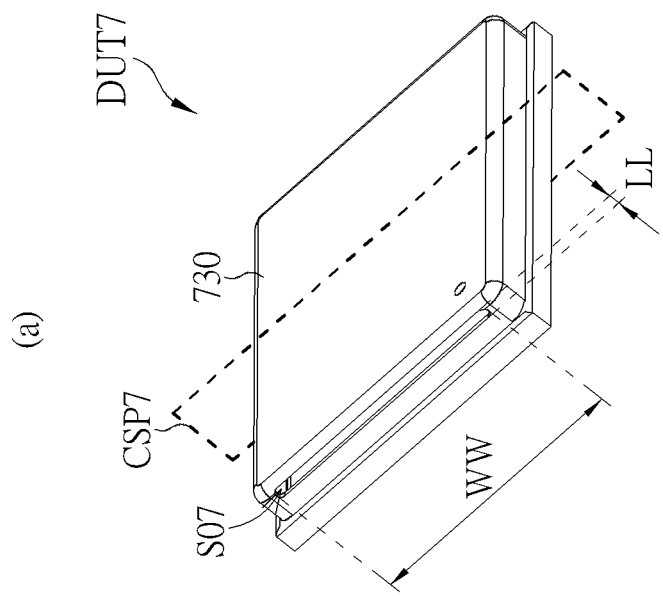
Figure 8:
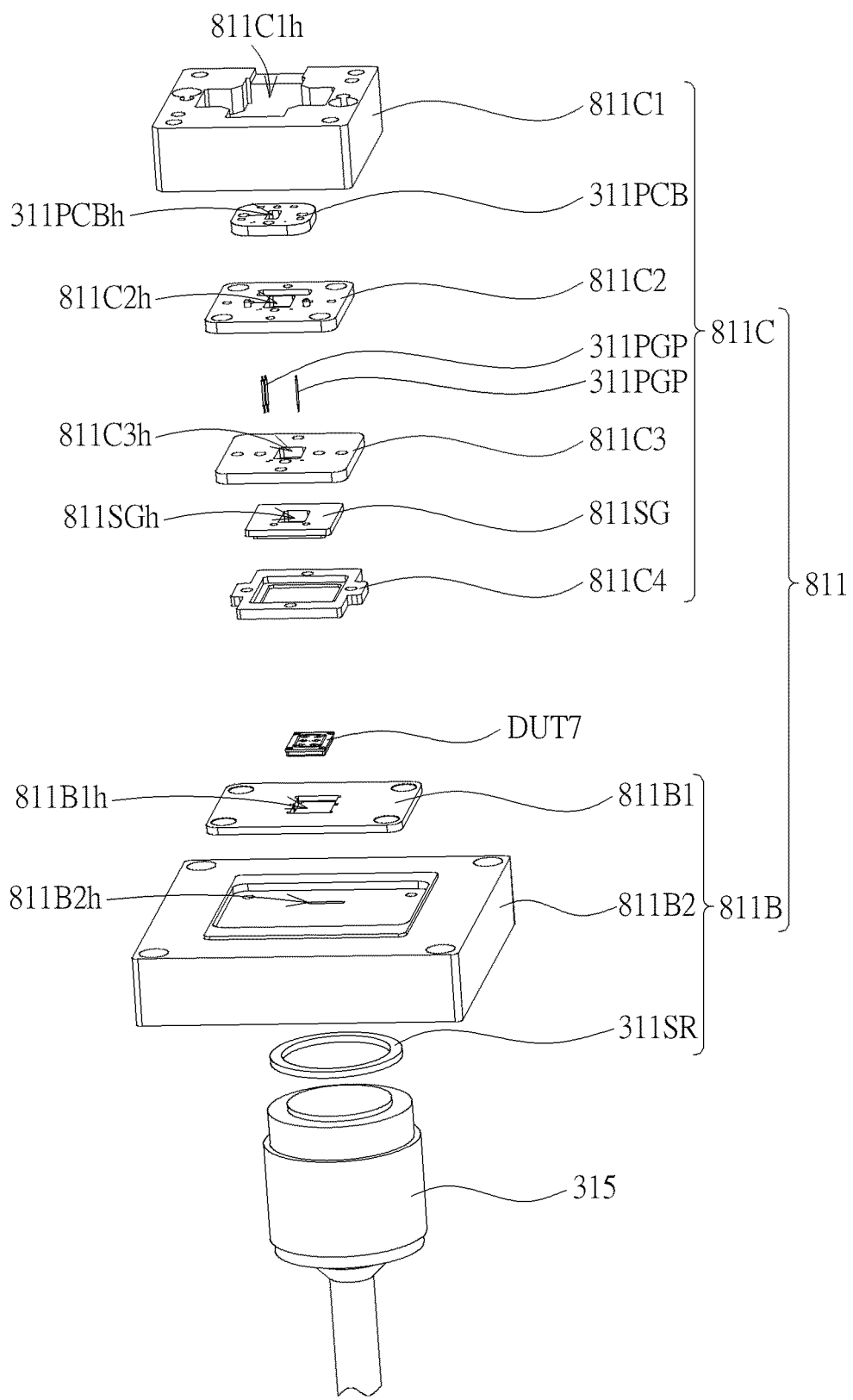
FIG. 8 is a schematic diagram of a socket, the sound sensing device, and the under-test device shown in FIG. 7 in an exploded view according to an embodiment of the present invention.
Figure 9:
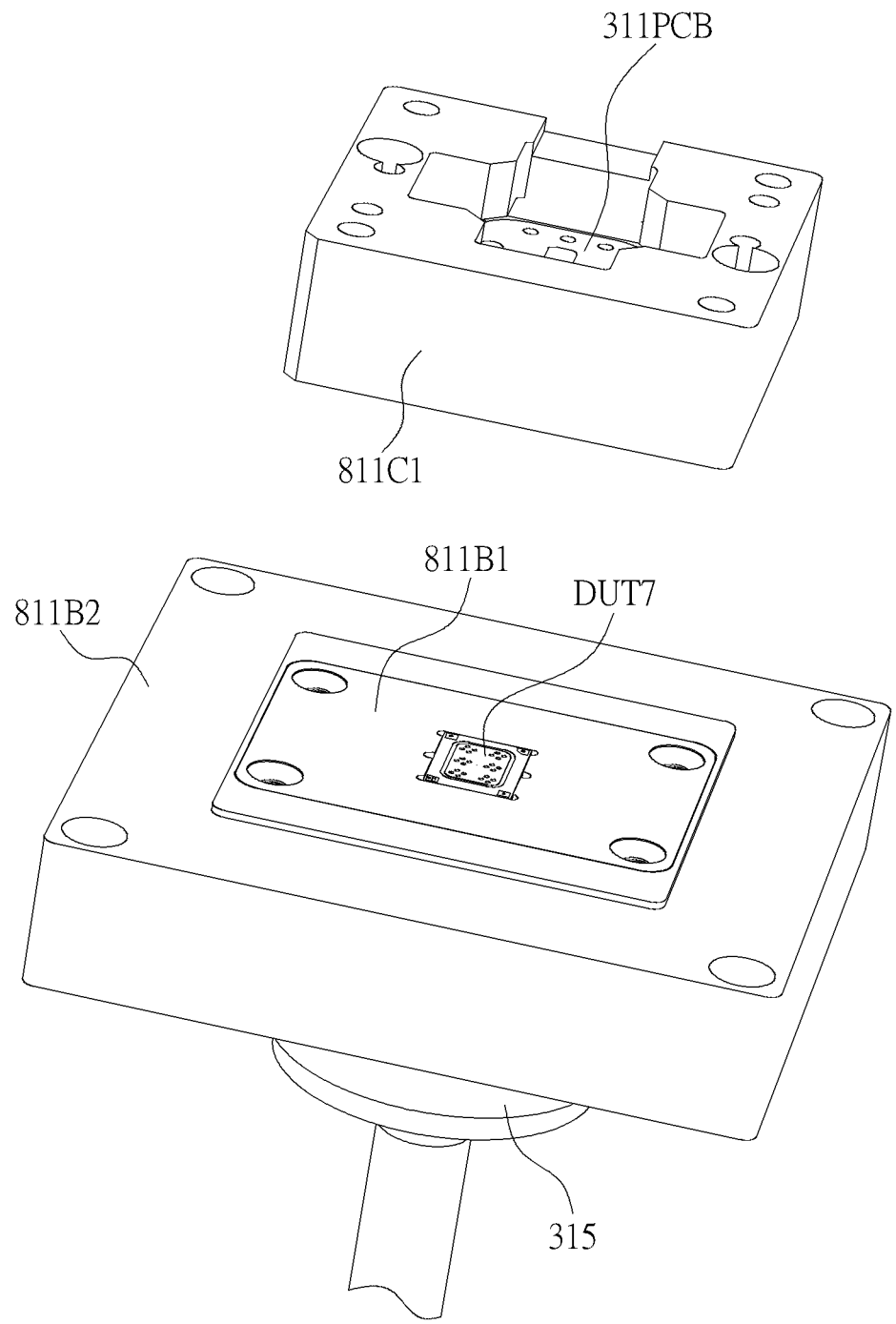
FIG. 9 is a schematic diagram illustrating the socket, the sound sensing device, and the under-test device shown in FIG. 8 when the socket is open/exposed.
Figure 10:
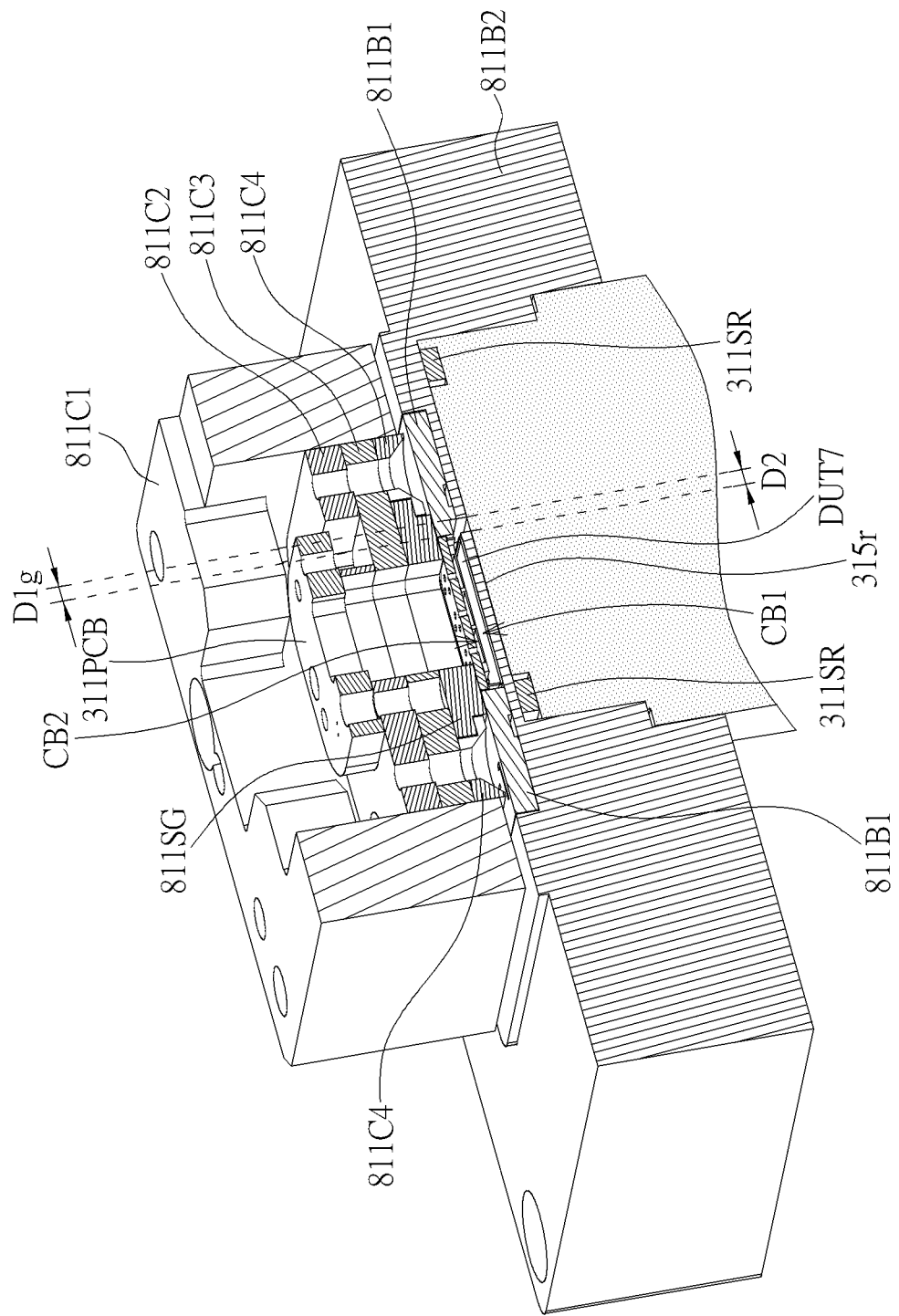
FIG. 10 is a schematic diagram illustrating the socket, the sound sensing device, and the under-test device shown in FIG. 8 when the socket is closed/shielded.
Figure 11:
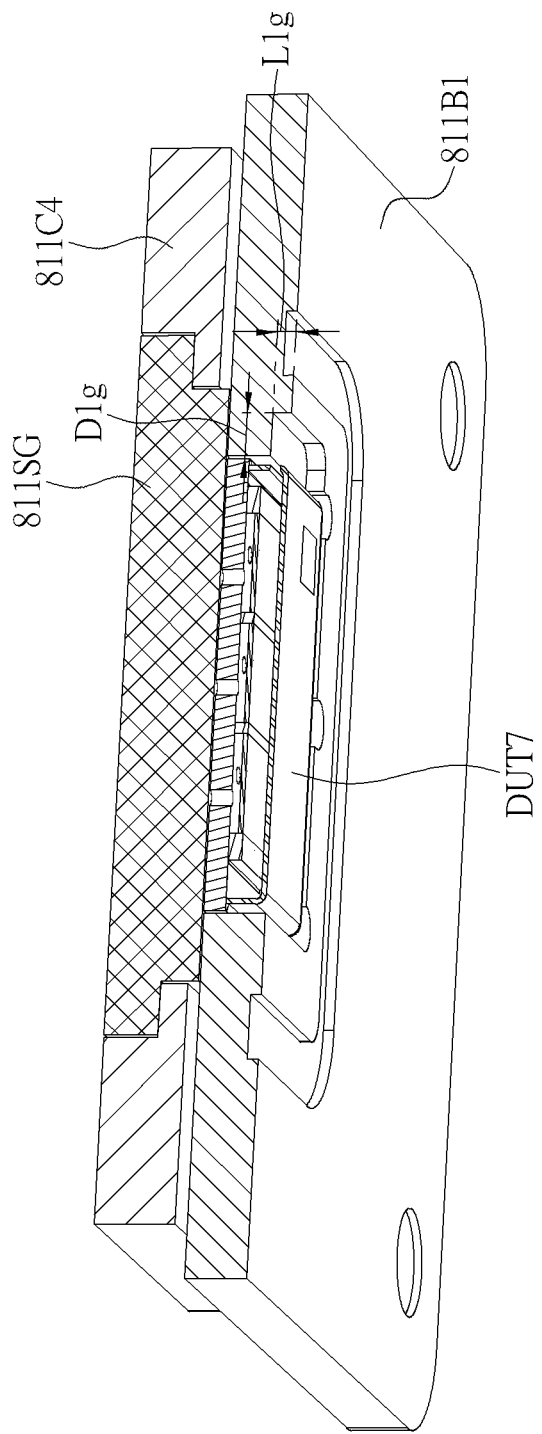
FIG. 11-FIG. 13 are schematic diagrams of the socket and the sound sensing device shown in FIG. 8.
Figure 12:
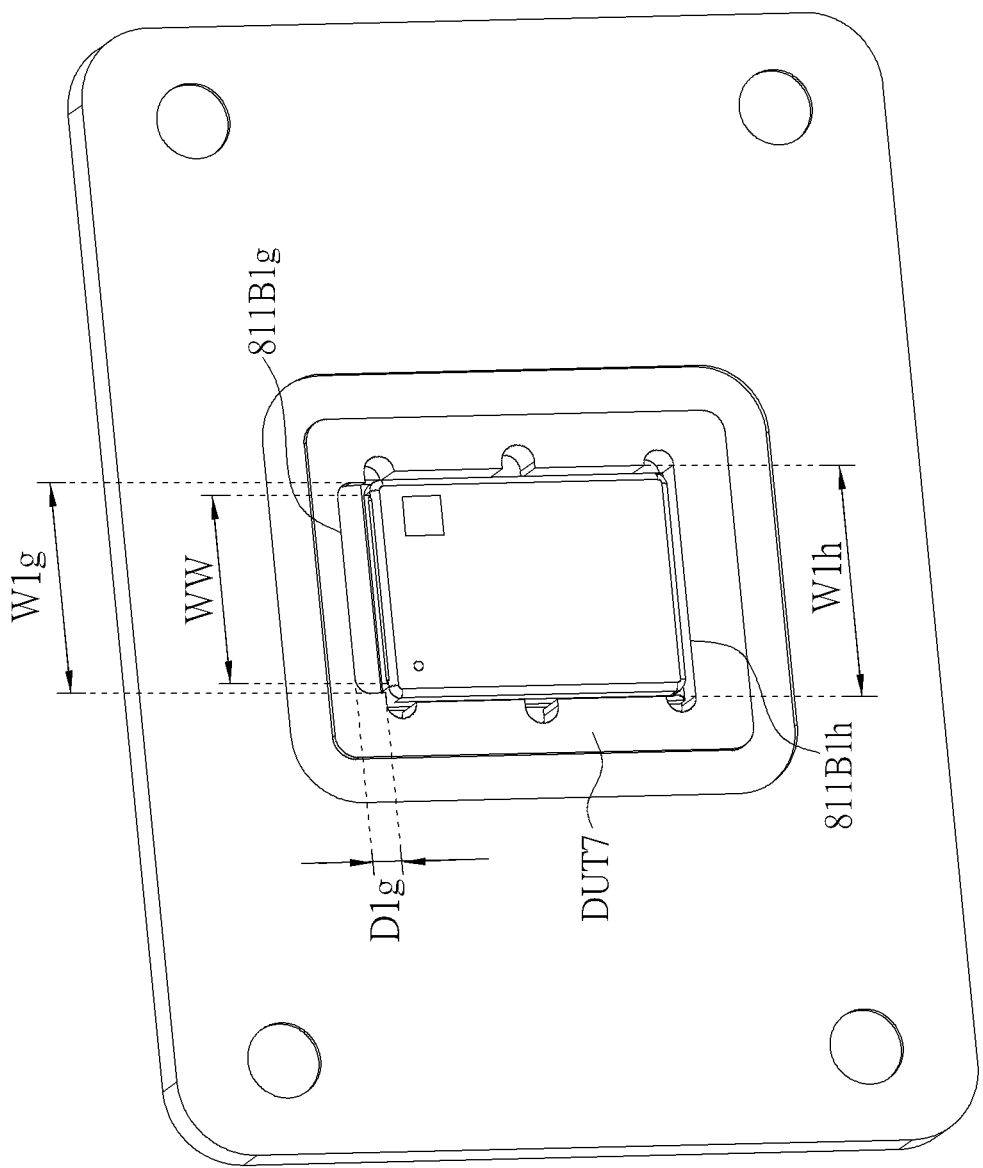
Figure 13:
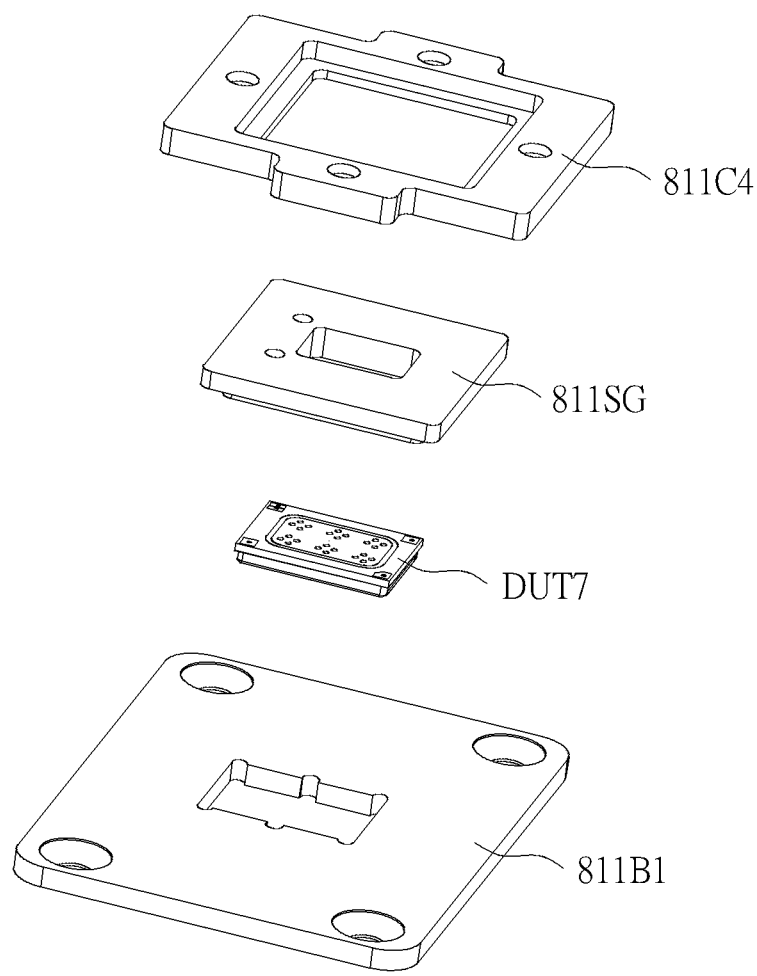

The structure of the socket 311 may vary with the structure of the under-test device DUT2. For example, FIG. 7 is a schematic diagram of an under-test device DUT7 according to an embodiment of the present invention. FIG. 8 is a schematic diagram of a socket 811, the sound sensing device 315, and the under-test device DUT7 shown in FIG. 7 in an exploded view according to an embodiment of the present invention. FIG. 9 is a schematic diagram illustrating the socket 811, the sound sensing device 315, and the under-test device DUT7 when the socket 811 is open/exposed. FIG. 10 is a schematic diagram illustrating the socket 811, the sound sensing device 315, and the under-test device DUT7 when the socket 811 is closed/shielded. FIG. 11-FIG. 13 are schematic diagrams of the socket 811 and the sound sensing device 315.

FIG. 7a illustrates a view of the under-test device DUT2. FIG. 7b illustrates a cross-sectional view taken along a cross-sectional plane CSP7 shown in FIG. 7a. Compared to the sound outlet opening S02 of the cap 230 of the under-test device DUT2 shown in FIG. 2, a sound outlet opening S07 of a cap 730 of the under-test device DUT7 shown in FIG. 7 may be situated on the lateral side of the chip 120 (perpendicular to the membrane 222 of the chip 220). Therefore, the under-test device DUT7 may be classified into a side firing sound producing device. In other words, side firing refers to a package structure where the sound outlet opening is formed on a side wall of the cap 730, as shown in FIG. 7, and the side wall of the cap 730 is (substantially) perpendicular to the membrane 222. The under-test device DUT7 may have a package structure similar to that disclosed in U.S. application Ser. No. 17/348,773, which is incorporated herein by reference.

As shown in FIG. 8, the socket 811 may include a socket cover 811C and a socket base 811B. Compared to the socket cover 311C shown in FIG. 3, the socket cover 811C shown in FIG. 8 may include socket cover components 811C1-811C4, and/or a sealing component 811SG apart from the (springy) pogo pins 311PGP, and/or the printed circuit board 311PCB.

To expel air from the back/second sub-chamber CB2 to the outside, the socket cover components 811C1-811C3, the sealing component 811SG, and the printed circuit board 311PCB have openings 811C1h-811C3h, 811SGh and 311PCBh respectively. As shown in FIG. 10, the openings 811C1h-811C3h, 811SGh and 311PCBh of the socket 811 are designed according to the distribution of the back opening(s) B02 of the under-test device DUT7 so as to, for example, allow air to flow in/out freely. Take the sealing component 811SG as an example: The area of the opening 811SGh is larger than or equal to the distribution area of the back opening(s) B02. The opening 811SGh overlaps all the back opening(s) B02.

Compared to the socket base 311B shown in FIG. 3, the socket base 811B shown in FIG. 7 may include socket base components 811B1-811B2 apart from the silicone ring 311SG. As shown in FIG. 12, which illustrates a bottom view of the socket base component 811B1 and the under-test device DUT7, the socket base component 811B1 has not only an opening 811B1h but also a groove 811B1g. The area/perimeter/contour of the opening 811B1h of the socket base component 811B1 is similar to the area/perimeter/contour of the under-test device DUT7 to fix the under-test device DUT7 to the socket base component 811B1. The width Wig of the groove 811B1g of the socket base component 811B1 is narrower than or equal to the width W1h of the opening 811B1h of the socket base component 811B17 to prevent the under-test device DUT7 from sliding out.

To transmit the testing sound from the sound outlet opening S07 of the under-test device DUT7, the socket base component 811B2 has an opening 811B2h. As shown in FIG. 11, the width Wig or the length L1g of the groove 811B1g of the socket base component 811B1 is designed according to the size (for example, the width WW or the length LL) of the sound outlet opening S07 of the under-test device DUT7 so as to, for example, output the testing sound to the sound sensing device 315. The width Wig or the length L1g of the groove 811B1g of the socket base component 811B1 may be wider than or equal to the width WW or the length LL of the sound outlet opening S07 of the under-test device DUT7. As shown in FIG. 10, the depth D2 of the opening 811B2h of the socket base component 811B2 is designed according to the depth D1g of the groove 811B1g of the socket base component 811B1 so as to, for example, output the testing sound to the sound sensing device 315. The opening 811B2h overlaps the groove 811B1g. The geometric center of the sound outlet opening S07 is roughly aligned to the geometric center of the groove 811B1g of the socket base component 811B1 or the geometric center of the receiving surface 315r of the sound sensing device 315.

As shown in FIG. 10, the sealing component 811SG of the socket 811 is configured to isolate the front/first sub-chamber CB1 of the under-test device DUT7 from the back/second sub-chamber CB2 of the under-test device DUT7 as shown in FIG. 10 when the under-test device DUT7, which has been loaded to the testing platform 112, produces the testing sound according to the testing signal(s). Hence, when the membrane 222 of the under-test device DUT7 vibrates, air pressure changes of the back/second sub-chamber CB2 would not interfere with those of the front/first sub-chamber CB1. The air pressure changes of the front/first sub-chamber CB1 travel as waves through the groove 811B1g and the opening 811B2h of the socket base 811B and are detected/measured by the sound sensing device 315.

In a word, the socket base 811B of the socket 811 has the groove 811B1g and the opening 811B2h for the testing sound from the under-test device DUT7 to pass through and travel outwards to the sound sensing device 315. The sealing component 811SG prevents air leakage from the back/second sub-chamber CB2 and/or into the front/first sub-chamber CB1 during testing, and the air pressure changes of the back/second sub-chamber CB2 would propagate across the openings 811C1h-811C3h, 811SGh, and 311PCBh of the socket cover 811C of the socket 811 without interfering with the air pressure changes of the front/first sub-chamber CB1. These improve testing quality and/or enhance the quality of the testing sound being generated.

As shown in FIG. 10, the receiving surface 315r of the sound sensing device 315 is parallel to the membrane 222 of the under-test device DUT7 while the sound outlet opening S07 is located on the lateral side (perpendicular to the membrane 222) of the cap 730 of the under-test device DUT7. The structure of the socket base 811B of the socket 811 is designed according to the arrangement/structure of the sound sensing device 315 and the under-test device DUT7.

Figure 14:
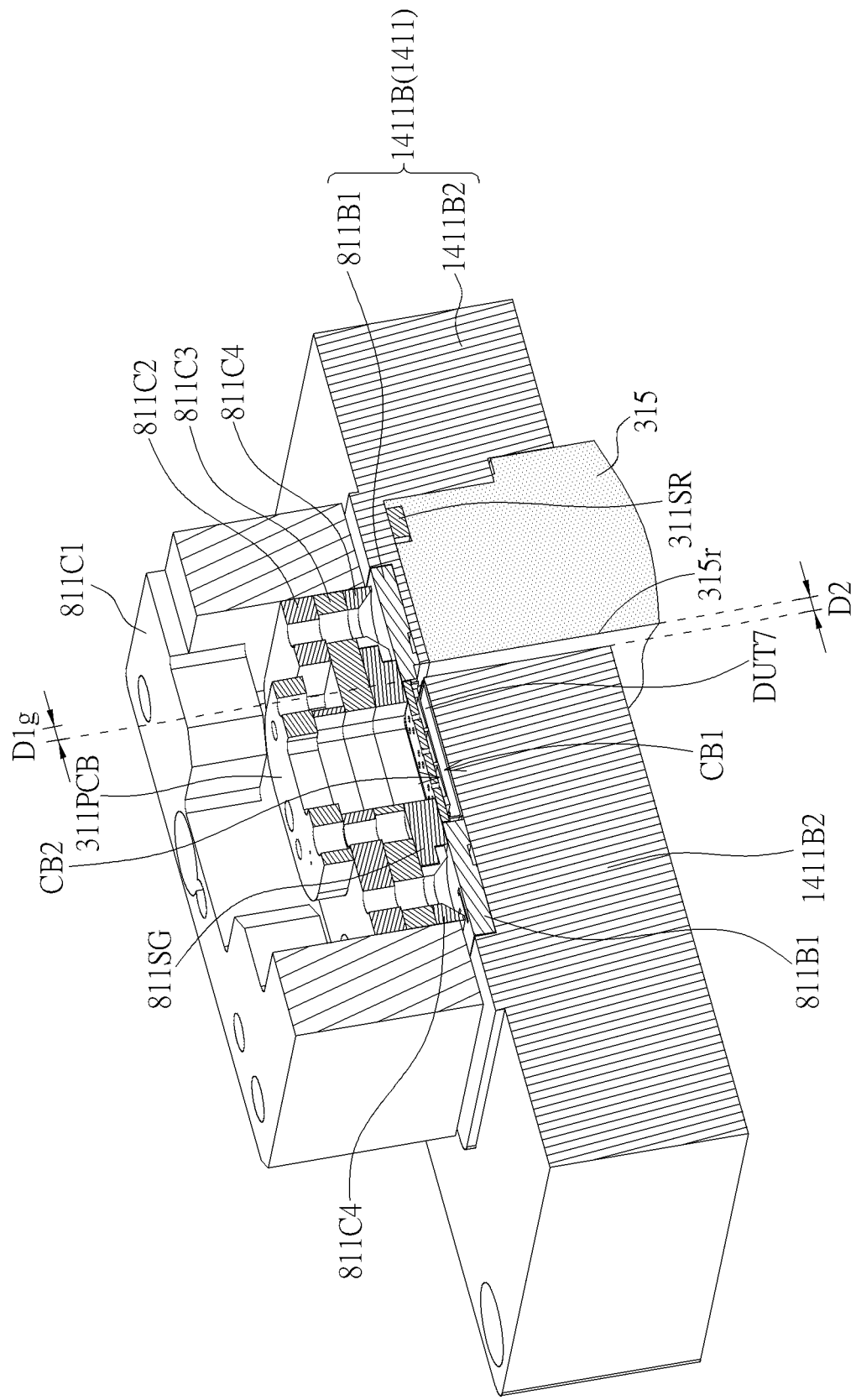
FIG. 14 is a schematic diagram of a socket, the sound sensing device, and the under-test device according to an embodiment of the present invention.

The structure of the socket base may vary according to the arrangement/structure of the sound sensing device and/or the under-test device. FIG. 14 is a schematic diagram of a socket 1411, the sound sensing device 315, and the under-test device DUT7 according to an embodiment of the present invention. Compared to the socket base component 811B2 of the socket base 811B shown in FIG. 10, a socket base component 1411B2 of a socket base 1411B of the socket 1411 shown in FIG. 14 is shaped so that the receiving surface 315r of the sound sensing device 315 is perpendicular to the membrane 222 of the under-test device DUT7 but parallel to the lateral side (on which the sound outlet opening S07 is located) of the cap 730 of the under-test device DUT7.

Note that, in FIG. 8, the socket base 811B of the socket 811 accommodates one sound sensing device 315 and one under-test device DUT7. Each sound sensing device 315 corresponds to one under-test device DUT7.

Figure 15:
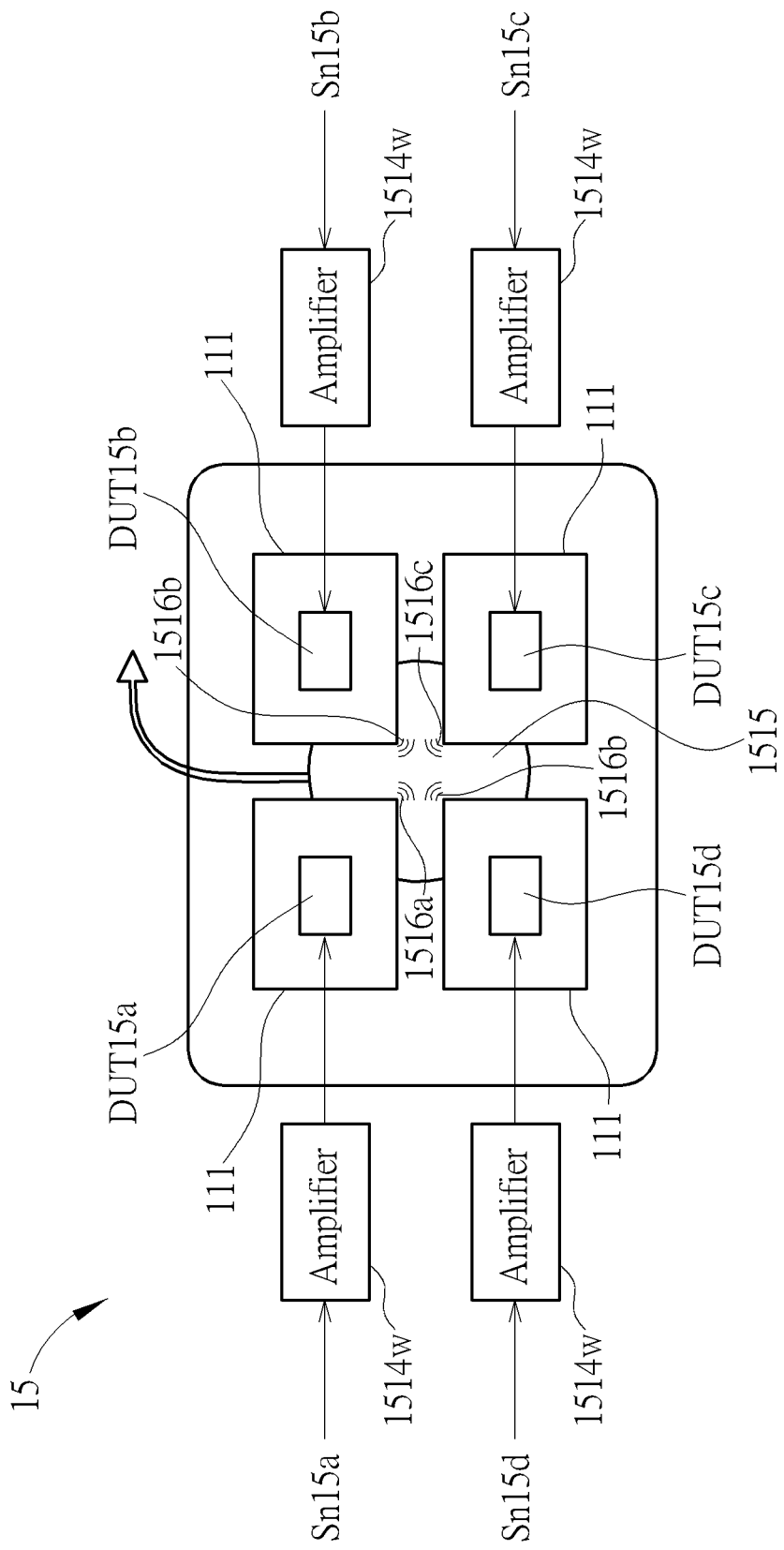
FIG. 15 is a schematic diagram of an acoustic testing system according to an embodiment of the present invention.

In another aspect, one sound sensing device 315 may correspond to more than one under-test devices. FIG. 15 is a schematic diagram of an acoustic testing system 15 according to an embodiment of the present invention. The acoustic testing system 15 includes under-test devices DUT15a-DUT15d and a testing apparatus 1510. The testing apparatus 1510 may include a sound sensing device 1515, amplifiers 1514m, apart from the sockets 111, the testing platform 112, the loading device 113, the testing-signal generating device 114, the tester 116, the unloading device 117, and/or the control unit 119.

Compared to the acoustic testing system 10, testing of the under-test devices DUT15a-DUT15d may take place in parallel. The testing-signal generating device 114 may transmit testing signals Sn15a-Sn15d, which correspond to different frequencies/tones, to the under-test devices DUT15a-DUT15d respectively at a time. After receiving the testing signals Sn15a-Sn15d respectively at the same time, the under-test devices DUT15a-DUT15d may produce testing sounds TS15a-TS15d respectively, the testing sounds TS15a-TS15d may be superimposed to constitute a testing sound. The sound sensing device 1515 may detect testing sounds TS15a-TS15d, which correspond to frequencies different from each other, at a time. By providing the testing signals Sn15a-Sn15d of different frequencies/tones to the under-test devices DUT15a-DUT15d, the tester 116 can distinguish each of the testing sounds TS15a-TS15d because the testing sounds TS15a-TS15d produced from the under-test devices DUT15a-DUT15d have different frequencies respectively. In this way, audio performance of each of the under-test devices DUT15a-DUT15d can be determined individually. The parallelization of testing the under-test devices DUT15a-DUT15d may reduce the number of the sound sensing device(s) and the testing cost/space.

Each of the under-test devices DUT15a-DUT15d may be a sound producing device such as a packaged under-test device, a (semiconductor packaged) speaker, a die on a wafer, or a sound producing die formed on a wafer before a singular/sawing process is performed.

The testing apparatus 110/1510 of the present invention may perform acoustic test as well as DC (direct current) test. FIG. 16 is a schematic diagram of an acoustic testing system 16 according to an embodiment of the present invention. The acoustic testing system 16 may be implemented by the acoustic testing system 10 or 15.

FIG. 16a illustrates the DC test. During the DC test, the testing-signal generating device 114 may input testing signal (s) such as DC voltage(s) Vdc to an under-test device DUT16, and circuit behavior(s) of the under-test device DUT16 may then be electrically tested/measured by the tester 116. The DC test typically includes tests for capacitance, leakage (on input pins and/or tri-state pins), opens and shorts, voltage levels, and/or standby current/active power dissipation. The DC test may verify that all bond wires are connected properly, check signal continuity to the under-test device DUT16, verify operational characteristics, and/or determine whether the under-test device DUT16 functions according to standard requirements.

FIG. 16b illustrates the acoustic test. During the acoustic test, the testing-signal generating device 114 inputs testing signal(s) such as input signal(s)/voltage(s) Sn16 to the under-test device DUT16, the sound sensing device 1615 may then receive/detect the testing sound TS16 generated by the under-test device DUT16. The tester 116 may analyze the output of a sound sensing device 1615 to verify acoustic functionality of the under-test device DUT16. The acoustic test may involve sound intensity, sound power, sound quality, or sound spectral measurement. For example, the testing apparatus 110 may measure the sound-pressure-level (SPL) or total-harmonic-distortion (THD) of the under-test device DUT16. The acoustic testing system 16 may check whether the sound-pressure-level of the testing sound TS16 exceeds certain threshold, such as 55 decibel (dB). The acoustic testing system 16 may determine whether distortion is created or increased.

The testing apparatus 110/1510 may be dedicated to a final test. Basically, a semiconductor manufacturing process (by which a wafer is formed), wafer-level DC and acoustic test(s), a singular/sawing process, a packaging process (by which each separated die is packaged and/or by which each separated die is mounted in an enclosure), and a final test are performed and follow the sequence outlined above. The under-test device DUT16, which may be a micro electro mechanical system (MEMS), may be formed by the semiconductor manufacturing process. Defects such as contamination or metal shorts that may occur during the semiconductor manufacturing process are examined at the wafer-level DC and acoustic test(s). The wafer-level DC and acoustic test(s) is/are disclosed in U.S. application Ser. No. 17/009,789, which is incorporated herein by reference, and performed at wafer level. Defects such as wire shorts, lifted balls and bridging, which are created after the semiconductor manufacturing process, are screened at the final test. The final test may be performed on a packaged speaker (namely, the under-test device DUT16) by the testing apparatus 110/1510 and include the acoustic test and the DC test.

In summary, the present application makes use of the conventional semiconductor testing process for mass production to ensure high reliability and achieve high throughput. Moreover, microphone(s) is/are disposed in a testing apparatus of the present application since the present application aims to perform (final) test on (semiconductor packaged) speakers. In addition, to improve testing quality, the testing apparatus of the present application further includes a sealing component to prevent air pressure changes of a back/second sub-chamber of a speaker from interfering with air pressure changes of a front/first sub-chamber of the speaker during testing.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A testing apparatus, comprising:
   a testing platform;
   a loading device, configured to load a plurality of under-test devices to the testing platform, wherein the plurality of under-test devices produces sound;
   a testing-signal generating device, configured to generate at least one testing signal, wherein the plurality of under-test devices receives the at least one testing signal and produces at least one testing sound according to the at least one testing signal;
   a socket, disposed on the testing platform, wherein each under-test device comprises a first chamber and a second chamber, the socket comprises a sealing component, and the sealing component is configured to isolate the first chamber from the second chamber when the each under-test device is loaded on the testing platform and produces a part of the at least one testing sound;
   a sound sensing device, configured to receive the at least one testing sound produced by at least one of the plurality of under-test devices;
   a control unit; and
   an unloading device, wherein the control unit controls the unloading device to unload the plurality of under-test devices from the testing platform and controls the unloading device to categorize the plurality of under-test devices into a plurality of groups according to the at least one testing sound produced by the at least one under-test device and received by the sound sensing device.

2. The testing apparatus of claim 1, wherein the sealing component has an opening, an area of the opening is larger than or equal to an area of a sound outlet opening of the each under-test device, and the each under-test device is a top firing sound producing device.

3. The testing apparatus of claim 1, wherein the socket comprises a socket base, the socket base has an opening, an area of the opening is larger than or equal to an area of a sound outlet opening of the each under-test device, and the each under-test device is a top firing sound producing device.

4. The testing apparatus of claim 1, wherein the sealing component has an opening, an area of the opening is larger than or equal to a distribution area of back openings of the each under-test device, and the each under-test device is a side firing sound producing device.

5. The testing apparatus of claim 1, wherein the socket comprises a socket base, the socket base has an opening and a groove, a size of the groove is wider than or equal to a size of a sound outlet opening of the each under-test device, and the each under-test device is a side firing sound producing device.

6. The testing apparatus of claim 1, wherein a geometric center of a receiving surface of the sound sensing device is aligned to a geometric center of an opening of the sealing component, a geometric center of a sound outlet opening of the each under-test device, or a geometric center of a groove of the socket.

7. The testing apparatus of claim 1, wherein the socket comprises a socket cover, the socket cover has at least one opening, the at least one opening connects to the second chamber for air pressure changes to propagate across the at least one opening, and an area of the at least one opening is larger than or equal to an distribution area of back openings of the each under-test device.

8. The testing apparatus of claim 1, wherein at least one socket base component, the sealing component, the sound sensing device, or the each under-test device enclose a closed space.

9. The testing apparatus of claim 1, wherein
   the at least one testing signal comprises a plurality of testing signals;
   the plurality of testing signals has a plurality of tones;
   the plurality of testing signals with the plurality of tones is delivered to the plurality of under-test device, so as to produce the at least one testing sound.

10. A testing method, comprising:
    loading, by a testing apparatus, a plurality of under-test devices to a testing platform;
    generating at least one testing signal, the step of generating the at least one testing signal comprising:
       isolating a first chamber of each under-test device from a second chamber of the each under-test device when the each under-test device is loaded on the testing platform and produces a part of the at least one testing sound;
    the plurality of under-test devices receiving the at least one testing signal and producing at least one testing sound according to the at least one testing signal;
    sensing the at least one testing sound produced by at least one of the plurality of under-test devices; and
    categorizing, by the testing apparatus, the plurality of under-test devices into a plurality of groups according to the at least one testing sound produced by the at least one under-test device and received by a sound sensing device.

11. The testing method of claim 10, wherein
    the at least one testing signal comprises a plurality of testing signals;
    the plurality of testing signals has a plurality of tones;
    the plurality of testing signals with the plurality of tones is delivered to the plurality of under-test device, so as to produce the at least one testing sound.

12. A testing method, comprising:
    generating a plurality of electrical testing signals, wherein the plurality of electrical testing signals has a plurality of tones;
    delivering the plurality of electrical testing signals with the plurality of tones to the plurality of under-test devices;
    the plurality of under-test devices producing a testing sound according to the plurality of electrical testing signals;
    sensing the testing sound produced by the plurality of under-test devices; and
    categorizing the plurality of under-test devices into a plurality of groups according to the testing sound according to the plurality of electrical testing signals with the plurality of tones.

13. The testing method of claim 12, wherein the under-test device is packaged under-test device.

14. The testing method of claim 12, wherein the under-test device is a sound producing die formed on a wafer, and the steps of delivering the plurality of electrical testing signals with the plurality of tones to the plurality of under-test devices and the plurality of under-test devices producing the testing sound according to the plurality of electrical testing signals are performed before a singular process is performed on the wafer.

\* \* \* \* \*